(12) United States Patent
Murakami et al.

(10) Patent No.: US 9,466,706 B2
(45) Date of Patent: Oct. 11, 2016

(54) SEMICONDUCTOR DEVICE INCLUDING FIRST AND SECOND GATE INSULATING FILMS DISPOSED ON A SEMICONDUCTOR LAYER AND MANUFACTURING METHOD OF THE SAME

(71) Applicant: TOYODA GOSEI CO., LTD., Kiyosu-shi (JP)

(72) Inventors: Noriaki Murakami, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/754,435

(22) Filed: Jun. 29, 2015

(65) Prior Publication Data

US 2016/0013282 A1 Jan. 14, 2016

(30) Foreign Application Priority Data

Jul. 8, 2014 (JP) .................. 2014-140520

(51) Int. Cl.
*H01L 29/78* (2006.01)
*H01L 29/20* (2006.01)
(Continued)

(52) U.S. Cl.
CPC ........... *H01L 29/78* (2013.01); *H01L 21/0228* (2013.01); *H01L 21/28264* (2013.01);
(Continued)

(58) Field of Classification Search
CPC ............. H01L 29/42364; H01L 29/78; H01L 21/28264; H01L 21/0228; H01L 29/517; H01L 29/66446; H01L 29/511; H01L 29/4236; H01L 21/30612
See application file for complete search history.

(56) References Cited

U.S. PATENT DOCUMENTS 4,675,089 A * 6/1987 Lory ..................... C23C 16/403
204/164
6,573,547 B2 * 6/2003 Ahn ....................... H01L 28/40
257/296
(Continued)

FOREIGN PATENT DOCUMENTS

JP   2008-103408 A   5/2008
JP   2009-206312 A   9/2009
(Continued)

OTHER PUBLICATIONS

Kaupo Kukli et al., "Atomic layer epitaxy growth of aluminum oxide thin films from a novel Al(CH3)2Cl precursor and H2O", Journal of Vacuum Science and Technology A vol. 15(4), Jul./Aug. 1997, pp. 2214-2218.*

(Continued)

*Primary Examiner* — William Coleman
(74) *Attorney, Agent, or Firm* — McGinn IP Law Group, PPLC

(57) ABSTRACT

A semiconductor device, comprises: a semiconductor layer, a first gate insulating film, a second gate insulating film and a gate electrode. The semiconductor layer is mainly made of gallium nitride (GaN). The first gate insulating film is formed on the semiconductor layer by atomic layer deposition using ozone as an oxidizing agent and is mainly made of an oxide. The second gate insulating film is formed on the first gate insulating film by atomic layer deposition using oxygen plasma as an oxidizing agent, and is mainly made of an oxide and contains carbon (C) at a lower concentration than that in the first gate insulating film. The gate electrode is formed on the second gate insulating film.

20 Claims, 10 Drawing Sheets

(51) Int. Cl.
*H01L 29/423* (2006.01)
*H01L 29/66* (2006.01)
*H01L 21/306* (2006.01)
*H01L 21/02* (2006.01)
*H01L 21/28* (2006.01)
*H01L 29/51* (2006.01)

(52) U.S. Cl.
CPC ..... *H01L21/30612* (2013.01); *H01L 29/2003* (2013.01); *H01L 29/4236* (2013.01); *H01L 29/513* (2013.01); *H01L 29/66446* (2013.01); *H01L 29/66522* (2013.01); *H01L 29/517* (2013.01)

(56) References Cited

U.S. PATENT DOCUMENTS

| | | | |
|---|---|---|---|
| 7,067,438 B2* | 6/2006 | Derderian | C23C 16/40 438/681 |
| 8,748,977 B2* | 6/2014 | Kudou | H01L 29/4236 257/329 |
| 2011/0193095 A1 | 8/2011 | Nakata et al. | |
| 2013/0075789 A1 | 3/2013 | Kanamura et al. | |
| 2013/0168690 A1 | 7/2013 | Ikarashi et al. | |
| 2013/0240896 A1* | 9/2013 | Ozaki | H01L 29/7786 257/76 |
| 2013/0247972 A1* | 9/2013 | Mungekar | H01L 31/02167 136/256 |
| 2013/0292700 A1 | 11/2013 | Teramoto et al. | |

FOREIGN PATENT DOCUMENTS

| | | |
|---|---|---|
| JP | 2010-098141 A | 4/2010 |
| JP | 2012-156245 A | 8/2012 |
| JP | 2013-074069 A | 4/2013 |
| JP | 2013-140866 A | 7/2013 |
| JP | 2013-197220 A | 9/2013 |

OTHER PUBLICATIONS

Chang-Wook Jeong et al., "Plasma-Assisted Atomic Layer Grwoth of High-Quality Aluminum Oxide Thin Films", Japanese Journal of Applied Physics, vol. 40, Jan. 1, 2001, pp. 285-289.*

* cited by examiner

SEMICONDUCTOR DEVICE INCLUDING FIRST AND SECOND GATE INSULATING FILMS DISPOSED ON A SEMICONDUCTOR LAYER AND MANUFACTURING METHOD OF THE SAME

CROSS-REFERENCE TO RELATED APPLICATION

The present application claims priority from Japanese patent application P2014-140520 filed on Jul. 14, 2014, the entirety of disclosures of which is hereby incorporated by reference into this application.

BACKGROUND

1. Technical Field

The present invention relates to a semiconductor device and a manufacturing method of the same.

2. Related Art

MOSFETs (metal oxide semiconductor field effect transistors) using a semiconductor mainly made of gallium nitride (GaN) are known as semiconductor devices (semiconductor elements). This GaN-based MOSFET includes a semiconductor layer mainly made of GaN, a gate insulating film formed on the semiconductor layer and a gate electrode formed on the gate insulating film. The MOSFET is required to ensure sufficient channel mobility and reduce gate leakage current. The channel mobility denotes the mobility of a carrier moving through a channel area of the semiconductor layer. The gate leakage current denotes the electric current flowing from the semiconductor layer across the gate insulating layer to the gate electrode.

JP 2008-103408A describes a technique of forming a second gate insulating film made of an oxide on a first gate insulating film made of silicon nitride in a GaN-based MOSFET, in order to suppress a decrease in channel mobility due to formation of the gate insulating film. The method employable for formation of the first gate insulating film described in JP 2008-103408A is catalytic chemical vapor deposition (Cat-CVD).

JP 2013-74069A describes a technique of forming an oxide film that is a p-type semiconductor between an upper insulating film and a lower insulating film provided as a gate insulating film in a GaN-based high electron mobility transistor (HEMT), in order to reduce the gate leakage current. The methods employable for formation of the upper insulating film and the lower insulating film described in JP 2013-74069A are atomic layer deposition (ALD), plasma-enhanced chemical vapor deposition (plasma CVD) and sputtering.

SUMMARY

The technique of JP 2008-103408A has a problem that formation of a nitride film by ALD requires higher plasma energy than formation of an oxide film and thereby rather decreases the channel mobility, in the case that the gate insulating film is formed by ALD in order to improve the film quality of the gate insulating film. The technique of JP 2013-74069A, on the other hand, has a problem that formation of the p-type semiconductor between the upper insulating film and the lower insulating film undesirably complicates the structure of the gate insulating film and the manufacturing process. There is accordingly a need to provide a technique that improves the carrier mobility and reduces the gate leakage current in the GaN-based MOSFET. With respect to the semiconductor device and the manufacturing method of the same, there are other needs including downsizing, cost reduction, resource saving, easy manufacture, improvement of convenience and improvement of durability.

In order to solve at least part of the problems described above, the invention may be implemented by aspects described below.

(1) According to one aspect of the invention, there is provided a semiconductor device. This semiconductor device may comprise a semiconductor layer that is mainly made of gallium nitride (GaN); a first gate insulating film that is formed on the semiconductor layer by atomic layer deposition using ozone as an oxidizing agent and is mainly made of an oxide; a second gate insulating film that is formed on the first gate insulating film by atomic layer deposition using oxygen plasma as an oxidizing agent, is mainly made of an oxide and contains carbon (C) at a lower concentration than that in the first gate insulating film; and a gate electrode that is formed on the second gate insulating film. In this aspect, the first gate insulating film suppresses a decrease in channel mobility due to formation of the second gate insulating film, and the second gate insulating film reduces the gate leakage current. Accordingly this improves the carrier mobility, while reducing the gate leakage current.

(2) In the semiconductor device of the above aspect, the second gate insulating film may have a carbon concentration of lower than $1 \times 10^{19}$ atoms/cm$^3$. In this aspect, the second gate insulating film sufficiently reduces the gate leakage current.

(3) In the semiconductor device of the above aspect, the first gate insulating film may have a thickness of not less than 2 nm and not greater than 20 nm. This aspect suppresses a decrease in channel mobility due to the insufficient film thickness of the first gate insulating film, while suppressing an increase in gate leakage current due to the excessive film thickness of the first gate insulating film.

(4) In the semiconductor device of the above aspect, the second gate insulating film may be thicker than the first gate insulating film. In this aspect, the second gate insulating film more effectively reduces the gate leakage current.

(5) In the semiconductor device of the above aspect, the semiconductor layer may have a groove that is recessed in a thickness direction of the semiconductor layer, and the first gate insulating film and the second gate insulating film may be formed from outside of the groove over to inside of the groove. In this aspect, the first gate insulating film and the second gate insulating film formed in the groove suppress a decrease in channel mobility, while reducing the gate leakage current.

(6) In the semiconductor device of the above aspect, the first gate insulating film may be mainly made of one selected from the group consisting of silicon dioxide (SiO$_2$), aluminum oxide (Al$_2$O$_3$), hafnium oxide (HfO$_2$) and zirconium oxide (ZrO$_2$) as a main component, and the second gate insulating film may be mainly made of one selected from the group consisting of silicon dioxide (SiO$_2$), aluminum oxide (Al$_2$O$_3$), hafnium oxide (HfO$_2$) and zirconium oxide (ZrO$_2$) as a main component. This aspect easily provides the first gate insulating film and the second gate insulating film.

(7) According to another aspect of the invention, there is provided a manufacturing method of a semiconductor device. This manufacturing method of the semiconductor device may comprise forming a first gate insulating film that is mainly made of an oxide on a semiconductor layer that is mainly made of gallium nitride (GaN) by atomic layer deposition using ozone as an oxidizing agent; forming a second gate insulating film that is mainly made of an oxide on the first gate insulating film by atomic layer deposition using oxygen plasma as an oxidizing agent; and forming a gate electrode on the second gate insulating film. In this aspect, the first gate insulating film suppresses a decrease in channel mobility due to formation of the second gate insulating film, and the second gate insulating film reduces the gate leakage current. Accordingly this improves the carrier mobility, while reducing the gate leakage current.

(8) In the manufacturing method of the semiconductor device of the above aspect, the forming the first gate insulating film may form the first gate insulating film to have a film thickness of not less than 2 nm and not greater than 20 nm. This aspect suppresses a decrease in channel mobility due to the insufficient film thickness of the first gate insulating film, while suppressing an increase in gate leakage current due to the excessive film thickness of the first gate insulating film.

(9) In the manufacturing method of the semiconductor device of the above aspect, the forming the second gate insulating film may form the second gate insulating film to be thicker than the first gate insulating film. In this aspect, the second gate insulating film more effectively reduces the gate leakage current.

(10) The manufacturing method of the semiconductor device of the above aspect may further comprise forming in the semiconductor layer a groove that is recessed in a thickness direction of the semiconductor layer, before forming the first gate insulating film. The first gate insulating film and the second gate insulating film may be formed from outside of the groove over to inside of the groove. In this aspect, the first gate insulating film and the second gate insulating film formed in the groove suppress a decrease in channel mobility, while reducing the gate leakage current.

(11) The manufacturing method of the semiconductor device of the above aspect may further comprise treating surface of the semiconductor layer by wet etching, before forming the first gate insulating film. This aspect removes damage of the formed semiconductor layer, before forming the first gate insulating film. This accordingly improves the channel mobility in the semiconductor layer.

(12) The manufacturing method of the semiconductor device of the above aspect may further comprise maintaining temperature of the semiconductor layer to be not lower than 200° C. and not higher than 600° C. during formation of the first gate insulating film and the second gate insulating film. This aspect suppresses an increase in gate leakage current due to the insufficient temperature during formation of the first gate insulating film and the second gate insulating film, while suppressing deterioration of the film quality of the first gate insulating film and the second gate insulating film due to the excessive temperature during formation of the first gate insulating film and the second gate insulating film.

(13) In the manufacturing method of the semiconductor device of the above aspect, the forming the first gate insulating film may form the first gate insulating film by atomic layer deposition using an oxidizing agent containing ozone of not lower than 2 atomic percent and not higher than 30 atomic percent. This aspect suppresses failure in formation of the first gate insulating film due to the insufficient ozone, while suppressing deterioration of the film quality of the first gate insulating film due to the excessive ozone.

(14) In the manufacturing method of the semiconductor device of the above aspect, the forming the second gate insulating film may form the second gate insulating film by atomic layer deposition using as the oxidizing agent oxygen plasma generated by a high frequency power source of not less than 200 W and not greater than 2000 W. This aspect suppresses an increase in gate leakage current due to the insufficient power of the high frequency power source, while suppressing deterioration of the film quality of the second gate insulating film due to the excessive power of the high frequency power source.

(15) The manufacturing method of the semiconductor device of the above aspect may further comprise processing the first gate insulating film and the second gate insulating film by annealing process at a temperature of not lower than 300° C. and not higher than 900° C. This aspect suppresses an increase in gate leakage current due to carbon remaining in the first gate insulating film and the second gate insulating film by the insufficient annealing process, while suppressing an increase in gate leakage current due to deterioration of the first gate insulating film and the second gate insulating film by the excessive annealing process.

The invention may be implemented by a variety of aspects other than the semiconductor device and the manufacturing method of the same described above. For example, the invention may be actualized as an electric apparatus having the semiconductor device of the above aspect incorporated therein or a manufacturing apparatus for manufacturing the semiconductor device of the above aspect.

According to the semiconductor device and the manufacturing method of the same of the above aspects of the invention, the first gate insulating film suppresses a decrease in channel mobility due to formation of the second gate insulating film, and the second gate insulating film reduces the gate leakage current. This accordingly improves the carrier mobility, while reducing the gate leakage current.

BRIEF DESCRIPTION OF DRAWINGS

The invention will be described with reference to the accompanying drawings in which.

DESCRIPTION OF EMBODIMENTS

A. First Embodiment

A-1. Structure of Semiconductor Device

Figure 1:
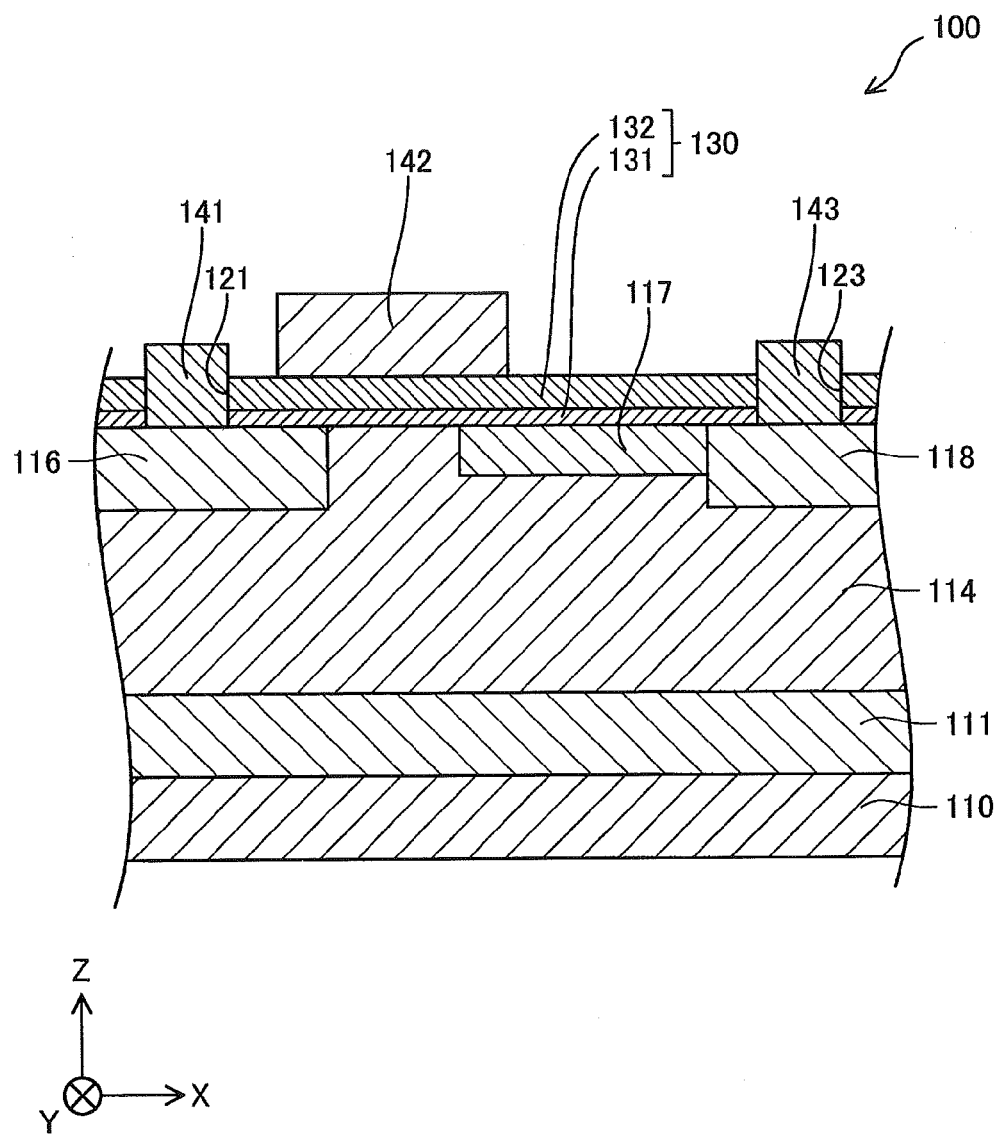
FIG. 1 is a sectional view schematically illustrating the structure of a semiconductor device according to a first embodiment.

FIG. 1 is a sectional view schematically illustrating the structure of a semiconductor device 100 according to a first embodiment. The semiconductor device 100 is a GaN-based semiconductor device formed by using gallium nitride (GaN). According to this embodiment, the semiconductor device 100 is a lateral MOSFET (metal oxide semiconductor field effect transistor). According to this embodiment, the semiconductor device 100 is used for power control and is also called power device.

XYZ axes orthogonal to one another are illustrated in FIG. 1. Among the XYZ axes in FIG. 1, the X axis is an axis going from the left side of the sheet surface to the right side of the sheet surface of FIG. 1; +X-axis direction is a direction going rightward on the sheet surface and −X-axis direction is a direction going leftward on the sheet surface. Among the XYZ axes in FIG. 1, the Y axis is an axis going from the front side of the sheet surface to the rear side of the sheet surface of FIG. 1; +Y-axis direction is a direction going backward on the sheet surface and −Y-axis direction is a direction going forward on the sheet surface. Among the XYZ axes in FIG. 1, the Z axis is an axis going from the lower side of the sheet surface to the upper side of the sheet surface of FIG. 1; +Z-axis direction is a direction going upward on the sheet surface and −Z-axis direction is a direction going downward on the sheet surface.

The semiconductor device 100 includes a substrate 110, a buffer layer 111, a semiconductor layer 114, a semiconductor layer 116, a semiconductor layer 117 and a semiconductor layer 118. The semiconductor device 100 further includes a gate insulating film 130, a source electrode 141, a gate electrode 142 and a drain electrode 143.

The substrate 110 of the semiconductor device 100 is formed in a plate-like shape extended along both the X axis and the Y axis. According to this embodiment, the substrate 110 is mainly made of silicon (Si).

The buffer layer 111 of the semiconductor device 100 is a layer that is located on the +Z-axis direction side of the substrate 110 and is extended along the X axis and the Y axis. The buffer layer 111 is placed between the substrate 110 and the semiconductor layer 114. The buffer layer 111 is a layer formed on the substrate 110 by epitaxial growth (crystal growth). According to this embodiment, the buffer layer 111 includes an undoped layer that is formed on the substrate 110 and is mainly made of aluminum nitride (AlN), and an undoped layer that is formed on the AlN-based undoped layer and is mainly made of gallium nitride (GaN).

The semiconductor layer 114 of the semiconductor device 100 is a p-type semiconductor layer mainly made of gallium nitride (GaN). The semiconductor layer 114 is a layer that is located on the +Z-axis direction side of the buffer layer 111 and is extended along the X axis and the Y axis. The semiconductor layer 114 is a layer formed on the buffer layer 111 by epitaxial growth. According to this embodiment, the semiconductor layer 114 contains magnesium (Mg) as acceptor.

The semiconductor layer 116 of the semiconductor device 100 is an n-type semiconductor layer mainly made of gallium nitride (GaN). The semiconductor layer 116 is an area formed by ion implantation on part of the +Z-axis direction side of the semiconductor layer 114. According to this embodiment, the semiconductor layer 116 contains silicon (Si) as donor.

The semiconductor layer 117 of the semiconductor device 100 is an n-type semiconductor layer mainly made of gallium nitride (GaN). The semiconductor layer 117 is an area formed by ion implantation on part of the +Z-axis direction side of the semiconductor layer 114. According to this embodiment, the semiconductor layer 117 is located on the +X-axis direction side of the semiconductor layer 116, and the semiconductor layer 114 is placed between the semiconductor layer 116 and the semiconductor layer 117. According to this embodiment, the semiconductor layer 117 contains silicon (Si) as donor at a lower concentration than those in the semiconductor layers 116 and 118.

The semiconductor layer 118 of the semiconductor device 100 is an n-type semiconductor layer mainly made of gallium nitride (GaN). Like the semiconductor layer 116, the semiconductor layer 118 is an area formed by ion implantation on part of the +Z-axis direction side of the semiconductor layer 114. According to this embodiment, the semiconductor layer 118 is adjacent to the +X-axis direction side of the semiconductor layer 117. According to this embodiment, the semiconductor layer 118 contains silicon (Si) as donor at a concentration equivalent to that in the semiconductor layer 116.

The gate insulating film 130 of the semiconductor device 100 is a layer having electrical insulating properties. The gate insulating film 130 is arranged to cover interfaces on the +Z-axis direction side of the respective semiconductor layers 114, 116, 117 and 118. The gate insulating film 130 includes a first gate insulating film 131 and a second gate insulating film 132.

The first gate insulating film 131 is an insulating film that has electrical insulating properties and is mainly made of an oxide. According to this embodiment, the main component of the first gate insulating film 131 is silicon dioxide ($SiO_2$). The first gate insulating film 131 is a film formed on the respective semiconductor layers 114, 116, 117 and 118 by atomic layer deposition (ALD) using ozone as an oxidizing agent. The first gate insulating film 131 contains carbon (C) at a higher concentration than that in the second gate insulating film 132.

The thickness (length in the Z-axis direction) of the first gate insulating film 131 is preferably not less than 2 nm (nanometer) and not greater than 20 nm, in terms of improving the carrier mobility and reducing the gate leakage current. According to the results of evaluation tests performed by the inventors, the thickness of the first gate insulating film 131 of less than 2 nm is likely to decrease the carrier mobility, while the thickness of the first gate insulating film 131 of greater than 20 nm is likely to increase the gate leakage current.

The second gate insulating film 132 is an insulating film that has electrical insulating properties and is mainly made of an oxide. According to this embodiment, the main component of the second gate insulating film 132 is silicon dioxide ($SiO_2$), like the first gate insulating film 131. The second gate insulating film 132 is a film formed on the first gate insulating film 131 by atomic layer deposition (ALD) using oxygen plasma as an oxidizing agent.

The second gate insulating film 132 contains carbon (C) at a lower concentration than that in the first gate insulating film 131. In terms of sufficiently reducing the gate leakage current by the second gate insulating film 132, the concentration of carbon in the second gate insulating film 132 is preferably lower than $1 \times 10^{19}$ atoms/cm$^3$. According to this embodiment, the average concentration of carbon (C) in the gate insulating film 130 is about $4 \times 10^{19}$ atoms/cm$^3$ with regard to the first gate insulating film 131 and is about $3 \times 10^{18}$ atoms/cm$^3$ with regard to the second gate insulating film 132.

The thickness (length in the Z-axis direction) of the second gate insulating film 132 is preferably greater than the thickness of the first gate insulating film 131, in terms of reducing the gate leakage current. According to the results of the evaluation tests performed by the inventors, the thickness of the second gate insulating film 132 is more preferably more than four times the thickness of the first gate insulating film 131 and is furthermore preferably more than nine times the thickness of the first gate insulating film 131.

The gate insulating film 130 has a contact hole 121 and a contact hole 123. The contact hole 121 is a through hole formed to pass through the first gate insulating film 131 and the second gate insulating film 132 and reach the semiconductor layer 116. The contact hole 123 is a through hole formed to pass through the first gate insulating film 131 and the second gate insulating film 132 and reach the semiconductor layer 118. According to this embodiment, the contact holes 121 and 123 are features formed by etching the gate insulating film 130.

The source electrode 141 of the semiconductor device 100 is an electrode formed in the contact hole 121. The second electrode 141 is in ohmic contact with the semiconductor layer 116. According to this embodiment, the source electrode 141 is an electrode formed by stacking a layer made of aluminum (Al) on a layer made of titanium (Ti) and subsequently alloying the stacked layers by annealing process (heat treatment).

The gate electrode 142 of the semiconductor device 100 is an electrode formed on the gate insulating film 130 to be placed between the source electrode 141 and the drain electrode 143. The gate electrode 142 is located on the +Z-axis direction side of the area of the semiconductor layer 114 placed between the semiconductor layer 116 and the semiconductor layer 117. According to this embodiment, the gate electrode 142 is mainly made of aluminum (Al). When a voltage is applied to the gate electrode 142, an inversion layer is formed in the area of the semiconductor layer 114 placed between the semiconductor layer 116 and the semiconductor layer 117. This inversion layer serves as a channel, so as to form a conductive path between the source electrode 141 and the drain electrode 143.

The drain electrode 143 of the semiconductor device 100 is an electrode formed in the contact hole 123. The drain electrode 143 is in ohmic contact with the semiconductor layer 118. According to this embodiment, the drain electrode 143 is an electrode formed by stacking a layer made of aluminum (Al) on a layer made of titanium (Ti) and subsequently alloying the stacked layers by annealing process (heat treatment).

A-2. Manufacturing Method of Semiconductor Device

Figure 2:
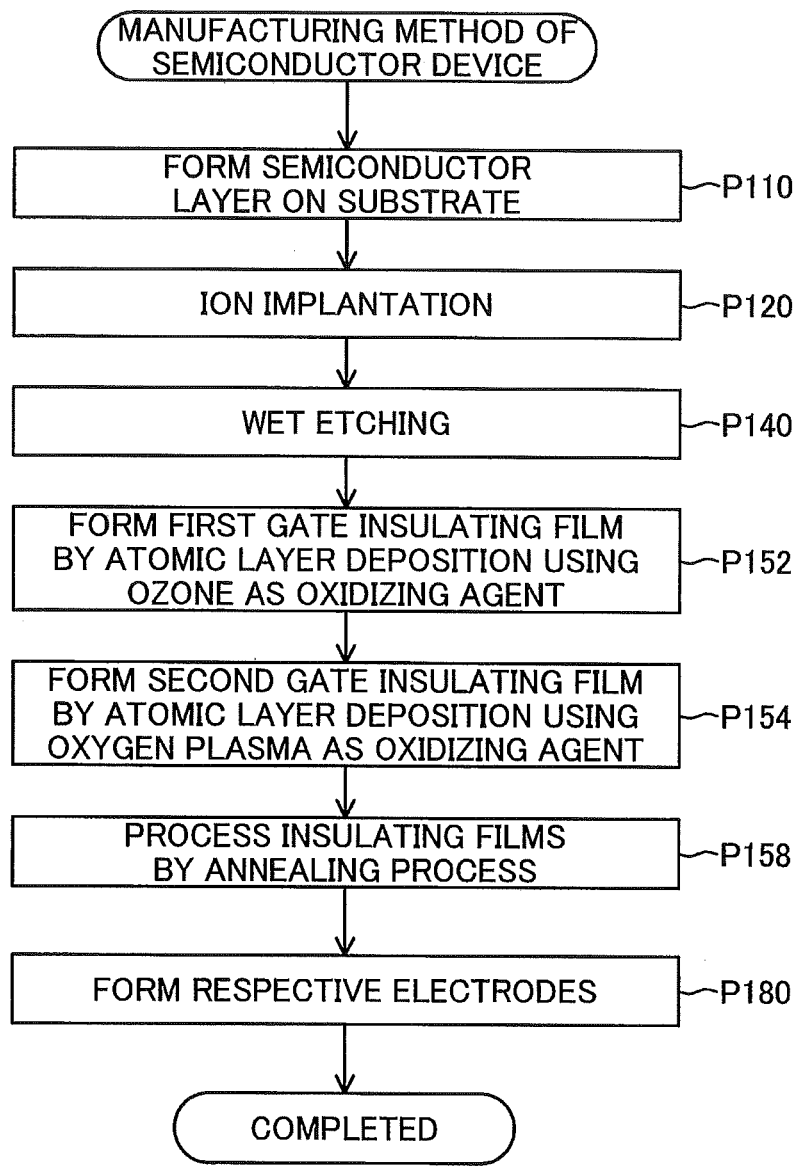
FIG. 2 is a process chart showing a manufacturing method of the semiconductor device according to the first embodiment.

FIG. 2 is a process chart showing a manufacturing method of the semiconductor device 100 according to the first embodiment. The manufacturer first forms the buffer layer 111 on the substrate 110 and subsequently forms the semiconductor layer 114 on the buffer layer 111 by epitaxial growth (process P110).

After forming the semiconductor layer 114 on the substrate 110 (process P110), the manufacturer forms the semiconductor layers 116, 117 and 118 by ion implantation into the semiconductor layer 114 (process P120). According to another embodiment, the manufacturer may form at least one semiconductor layer among the semiconductor layers 116, 117 and 118 by another technique such as impurity diffusion or selective regrowth.

After the ion implantation (process P120), the manufacturer treats the surfaces of the respective semiconductor layers 114, 116, 117 and 118 by wet etching (process P140). This removes damages of the respective semiconductor layers formed by ion implantation (process P120). According to this embodiment, the manufacturer uses tetramethylammonium hydroxide (TMAH) as an etchant. According to another embodiment, the manufacture may omit the wet etching (process P140).

After the wet etching (process P140), the manufacturer forms the first gate insulating film 131 on the respective semiconductor layers 114, 116, 117 and 118 by atomic layer deposition (ALD) using ozone (O3) as the oxidizing agent (process P152). According to this embodiment, the manufacturer deposits silicon dioxide (SiO$_2$) as the first gate insulating film 131 on the respective semiconductor layers 114, 116, 117 and 118. In terms of improving the carrier mobility and reducing the gate leakage current, the thickness of the first gate insulating film 131 is preferably not less than 2 nm and not greater than 20 nm.

According to this embodiment, in the ALD using ozone (O$_3$) as the oxidizing agent (process P152), the manufacturer places the semiconductor device 100 during manufacture in a reaction chamber and repeats the following steps a1 to a4 until the first gate insulating film 131 has a desired thickness:

(step a1) supplying a material gas into the reaction chamber;

(step a2) purging the material gas from the reaction chamber;

(step a3) supplying ozone (O$_3$) as the oxidizing agent into the reaction chamber; and (step a4) purging ozone from the reaction chamber.

In the ALD using ozone (O$_3$) as the oxidizing agent (process P152), the ozone concentration of the oxidizing agent is preferably not lower than 2 atomic percent and not higher than 30 atomic percent. According to the results of the evaluation tests performed by the inventors, the ozone concentration of lower than 2 atomic percent is likely to cause unstable film forming, while the ozone concentration of higher than 30 atomic percent is likely to cause uneven film thickness. According to this embodiment, the ozone concentration of the oxidizing agent is 8 atomic percent.

After forming the first gate insulating film 131 (process P152), the manufacturer forms the second gate insulating film 132 on the first gate insulating film 131 by atomic layer deposition (ALD) using oxygen plasma as the oxidizing agent (process P154). According to this embodiment, the manufacturer deposits silicon dioxide (SiO$_2$) as the second gate insulating film 132 on the first gate insulating film 131. In terms of reducing the gate leakage current, the thickness of the second gate insulating film 132 is preferably greater than the thickness of the first gate insulating film 131, is more preferably more than four times the thickness of the first gate insulating film 131, and is furthermore preferably more than nine times the thickness of the first gate insulating film 131.

According to this embodiment, in the ALD using oxygen plasma as the oxidizing agent (process P154), the manufacturer repeats the following steps b1 to b5 until the second gate insulating film 132 has a desired thickness, subsequent to the ALD using ozone (O3) as the oxidizing agent (process P152):

(step b1) supplying a material gas into the reaction chamber;

(step b2) purging the material gas from the reaction chamber;

(step b3) supplying oxygen ($O_2$) as the oxidizing agent into the reaction chamber;

(step b4) generating plasma in the reaction chamber using a high frequency power source; and (step b5) purging oxygen from the reaction chamber.

In the ALD using oxygen plasma as the oxidizing agent (process P154), the power of the high frequency power source for generating plasma is preferably not less than 200 W (watt) and not greater than 2000 W. According to the results of the evaluation tests performed by the inventors, the power of the high frequency power source of less than 200 W is likely to increase the gate leakage current, while the power of the high frequency power source of greater than 2000 W is likely to cause uneven film thickness. According to this embodiment, the power of the high frequency power source is 500 W.

The oxidizing power of the ALD using oxygen plasma (process P154) is higher than the oxidizing power of the ALD using ozone (process P152). Accordingly, the film formation rate in the ALD using oxygen plasma (process P154) is higher than the film formation rate in the ALD using ozone (process P152). It is thus expected that the amount of carbon (C) taken from the air into the second gate insulating film 132 is less than the amount of carbon into the first gate insulating film 131. According to this embodiment, the film formation rate in the ALD using ozone (process P152) is about $3.3 \times 10^{-2}$ nm/cycle, while the film formation rate in the ALD using oxygen plasma (process P154) is about $6.6 \times 10^{-2}$ nm/cycle. According to this embodiment, the carbon concentration by the ALD using ozone (process P152) is about $8.0 \times 10^{21}$ atoms/cm$^3$, while the carbon concentration by the ALD using oxygen plasma (process P154) is about $1.0 \times 10^{21}$ atoms/cm$^3$.

During formation of the first gate insulating film 131 and the second gate insulating film 132 (processes P152 and P154), the temperature of the respective semiconductor layers 114, 116, 117 and 118 is preferably maintained to be not lower than 200° C. and not higher than 600° C. According to the results of the evaluation tests performed by the inventors, the temperature of the respective semiconductor layers of lower than 200° C. is likely to increase the gate leakage current, while the temperature of the respective semiconductor layers of higher than 600° C. is likely to degrade the raw material in the middle of film formation and thereby cause uneven film thickness. According to this embodiment, during formation of the first gate insulating film 131 and the second gate insulating film 132 (processes P152 and P154), the manufacturer adjusts the temperature of a stage (platform) on which the semiconductor device 100 during manufacture is placed to 350° C., so as to maintain the temperature of the respective semiconductor layers 114, 116, 117 and 118 at 350° C.

After forming the second gate insulating film 132 (process P154), the manufacturer processes the first gate insulating film 131 and the second gate insulating film 132 by annealing process (heat treatment) (process P158). In terms of sufficiently reducing the gate leakage current by the second gate insulating film 132, the annealing process (process P158) preferably controls the carbon concentration in the second gate insulating film 132 to be lower than $1 \times 10^{19}$ atoms/cm$^3$. According to this embodiment, the annealing process (process P158) controls the carbon concentration in the first gate insulating film 131 to be about $4 \times 10^{19}$ atoms/cm$^3$ and controls the concentration in the second gate insulating film 132 to be about $3 \times 10^{18}$ atoms/cm$^3$.

According to this embodiment, the temperature of the annealing process (process P158) is preferably not lower than 300° C. and not higher than 900° C. According to the results of the evaluation tests performed by the inventors, the temperature of the annealing process (process P158) of lower than 300° C. is likely to increase the gate leakage current due to carbon remaining in the first gate insulating film 131 and the second gate insulating film 132, while the temperature of the annealing process (process P158) of higher than 900° C. is likely to increase the gate leakage current due to deterioration of the first gate insulating film 131 and the second gate insulating film 132.

After the annealing process (process P158), the manufacturer forms the source electrode 141, the gate electrode 142 and the drain electrode 143 (process P180). According to this embodiment, the manufacturer forms the source electrode 141 and the drain electrode 143 respectively in the contact hole 121 and in the contact hole 123 and subsequently forms the gate electrode 142 on the second gate insulating film 132. The manufacturer then processes the respective electrodes by annealing process (heat treatment). The semiconductor device 100 is completed through this series of processes.

In the first embodiment described above, the first gate insulating film 131 suppresses a decrease in channel mobility due to formation of the second gate insulating film 132, and the second gate insulating film 132 reduces the gate leakage current. Accordingly, this improves the carrier mobility, while reducing the gate leakage current.

The thickness of the first gate insulating film 131 of not less than 2 nm and not greater than 20 nm suppresses a decrease in channel mobility due to the insufficient film thickness of the first gate insulating film 131, while suppressing an increase in gate leakage current due to the excessive film thickness of the first gate insulating film 131.

When the second gate insulating film 132 is made thicker than the first gate insulating film 131, the second gate insulating film 132 more effectively reduces the gate leakage current.

The main component of the first gate insulating film 131 and the second gate insulating film is silicon dioxide ($SiO_2$), so that the first gate insulating film 131 and the second gate insulating film 132 are easily provided.

During formation of the first gate insulating film 131 and the second gate insulating film 132 (processes P152 and P154), maintaining the temperature of the semiconductor layers 114, 116, 117 and 118 to be not lower than 200° C. and not higher than 600° C. suppresses an increase in gate leakage current due to the insufficient temperature and suppresses deterioration of the film quality of the first gate insulating film 131 and the second gate insulating film 132 due to the excessive temperature.

Formation of the second gate insulating film 132 by atomic layer deposition using oxygen plasma, as the oxidizing agent, generated by the high frequency power source of not less than 200 W and not greater than 2000 W (process P154) suppresses an increase in gate leakage current due to insufficient power of the high frequency power source and suppresses deterioration of the film quality of the second gate insulating film 132 due to excessive power of the high frequency power source.

The annealing process of the first gate insulating film 131 and the second gate insulating film 132 at the temperature of not lower than 300° C. and not higher than 900° C. (process P158) suppresses an increase in gate leakage current due to carbon remaining in the first gate insulating film 131 and the second gate insulating film 132 by the insufficient annealing process and suppresses an increase in gate leakage current due to deterioration of the first gate insulating film 131 and the second gate insulating film 132 by the excessive annealing process.

B. Second Embodiment

B-1. Structure of Semiconductor Device

Figure 3:
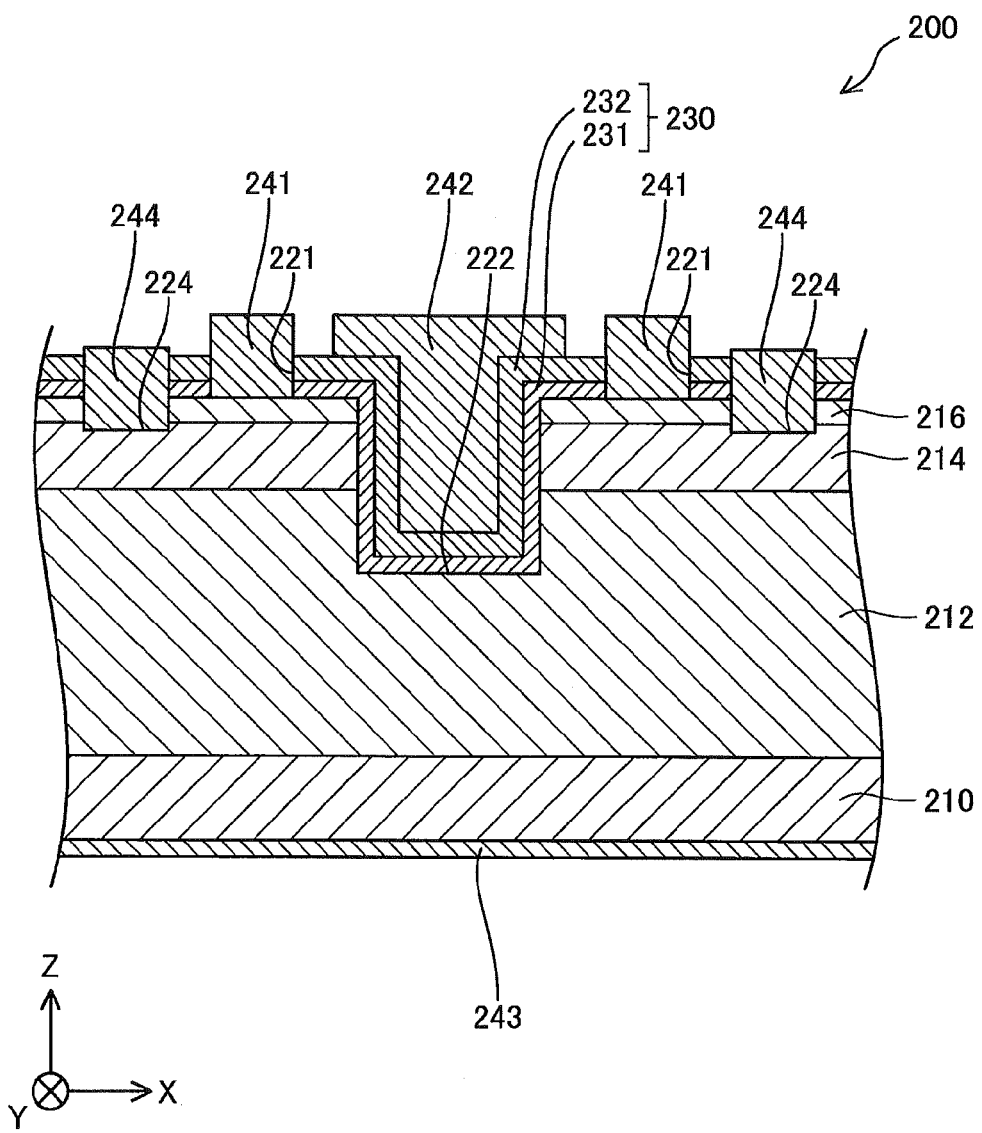
FIG. 3 is a sectional view schematically illustrating the structure of a semiconductor device according to a second embodiment.

FIG. 3 is a sectional view schematically illustrating the structure of a semiconductor device 200 according to a second embodiment. The semiconductor device 200 is a GaN-based semiconductor device formed by using gallium nitride (GaN). According to this embodiment, the semiconductor device 200 is a vertical trench MOSFET. According to this embodiment, the semiconductor device 200 is used for power control and is also called power device. Like FIG. 1, XYZ axes are illustrated in FIG. 3.

The semiconductor device 200 includes a substrate 210, a semiconductor layer 212, a semiconductor layer 214 and a semiconductor layer 216. The semiconductor device 200 has a trench 222 and recesses 224 as features formed in these semiconductor layers 212, 214 and 216. Additionally, the semiconductor device 200 includes a gate insulating film 230, source electrodes 241, a gate electrode 242, a drain electrode 243 and body electrodes 244. According to this embodiment, in the structure of the semiconductor device 200, its +X-axis direction side and −X-axis direction side are line symmetric with respect to the trench 222.

The substrate 210 of the semiconductor device 200 is formed in a plate-like shape extended along both the X axis and the Y axis. The substrate 210 is mainly made of gallium nitride (GaN). According to this embodiment, the substrate 210 contains silicon (Si) as donor.

The semiconductor layer 212 of the semiconductor device 200 is an n-type semiconductor layer mainly made of gallium nitride (GaN). The semiconductor layer 212 is a layer that is located on the +Z-axis direction side of the substrate 210 and is extended along the X axis and the Y axis. The semiconductor layer 212 is a layer formed on the substrate 210 by epitaxial growth. According to this embodiment, the semiconductor layer 212 contains silicon (Si) as donor at a lower concentration than that in the substrate 210.

The semiconductor layer 214 of the semiconductor device 200 is a p-type semiconductor layer mainly made of gallium nitride (GaN). The semiconductor layer 214 is a layer that is located on the +Z-axis direction side of the semiconductor layer 212 and is extended along the X axis and the Y axis. The semiconductor layer 214 is a layer formed on the semiconductor layer 212 by epitaxial growth. According to this embodiment, the semiconductor layer 214 contains magnesium (Mg) as acceptor.

The semiconductor layer 216 of the semiconductor device 200 is an n-type semiconductor layer mainly made of gallium nitride (GaN). The semiconductor layer 216 is a layer that is located on the +Z-axis direction side of the semiconductor layer 214 and is extended along the X axis and the Y axis. The semiconductor layer 216 is a layer formed on the semiconductor layer 214 by epitaxial growth. According to this embodiment, the semiconductor layer 216 contains silicon (Si) as donor at a higher concentration than that in the semiconductor layer 212.

The trench 222 of the semiconductor device 200 is a groove formed in the semiconductor layers 212, 214 and 216 to be recessed in a thickness direction (−Z-axis direction) of the semiconductor layers 212, 214 and 216. The trench 222 is formed from the +Z-axis direction side of the semiconductor layer 216 through the semiconductor layer 214 to reach the semiconductor layer 212. According to this embodiment, the trench 222 is a feature formed in the semiconductor layers 212, 214 and 216 by etching.

The gate insulating film 230 of the semiconductor device 200 is a layer having electrical insulating properties. The gate insulating film 230 is formed from outside of the trench 222 over to inside of the trench 222. The gate insulating film 230 is arranged to cover interfaces of the respective semiconductor layers 212, 214 and 216 defining the trench 222 and a +Z-axis direction side interface of the semiconductor layer 216. The gate insulating film 230 includes a first gate insulating film 231 and a second gate insulating film 232.

The first gate insulating film 231 is similar to the first gate insulating film 131 of the first embodiment, except that the first gate insulating film 231 is formed on the semiconductor layers 212, 214 and 216. The first gate insulating film 231 is a film formed by atomic layer deposition (ALD) using ozone as the oxidizing agent.

The second gate insulating film 232 is similar to the second gate insulating film 132 of the first embodiment, except that the second gate insulating film 232 is formed on the first gate insulating film 231. The second gate insulating film 232 is a film formed by atomic layer deposition (ALD) using oxygen plasma as the oxidizing agent.

The gate insulating film 230 has contact holes 221. The contact hole 221 is a through hole formed to pass through the first gate insulating film 231 and the second gate insulating film 232 and reach the semiconductor layer 216. According to this embodiment, the contact holes 221 are formed at two positions on the +X-axis direction side and the −X-axis direction side of the trench 222. According to this embodiment, the contact holes 221 are features formed in the gate insulating film 230 by etching.

The recesses 224 of the semiconductor device 200 are concaves recessed to pass through the first gate insulating film 231, the second gate insulating film 232 and the semiconductor layer 216 and reach the semiconductor layer 214. According to this embodiment, the recesses 224 are formed at two positions outside of the two contact holes 221 about the trench 222 as the center. According to this embodiment, the recesses 224 are features formed in the gate insulating film 230 and the semiconductor layers 214 and 216 by etching.

The source electrodes 241 of the semiconductor device 200 are electrodes formed in the respective contact holes 221. The source electrodes 241 are in ohmic contact with the semiconductor layer 216. According to this embodiment, the source electrode 241 is an electrode formed by stacking a layer made of aluminum (Al) on a layer made of titanium (Ti) and subsequently alloying the stacked layers by annealing process (heat treatment).

The gate electrode 242 of the semiconductor device 200 is an electrode formed in the trench 222 via the gate insulating film 230. According to this embodiment, the gate electrode 242 is mainly made of aluminum (Al). When a voltage is applied to the gate electrode 242, an inversion layer is formed in the semiconductor layer 214. This inversion layer serves as a channel, so as to form conductive paths between the source electrodes 241 and the drain electrode 243.

The drain electrode 243 of the semiconductor device 200 is an electrode formed on a −Z-axis direction side interface of the substrate 210. The drain electrode 243 is in ohmic contact with the substrate 210. According to this embodiment, the drain electrode 243 is an electrode formed by stacking a layer made of aluminum (Al) on a layer made of titanium (Ti) and subsequently alloying the stacked layers by annealing process (heat treatment).

The body electrodes 244 of the semiconductor device 200 are electrodes formed in the respective recesses 224. The boy electrodes 244 are in ohmic contact with the semiconductor layer 214. According to this embodiment, the body electrode 244 is an electrode formed by stacking a layer made of gold (Au) on a layer made of palladium (Pd) and subsequently alloying the stacked layers by annealing process (heat treatment).

B-2. Manufacturing Method of Semiconductor Device

Figure 4:
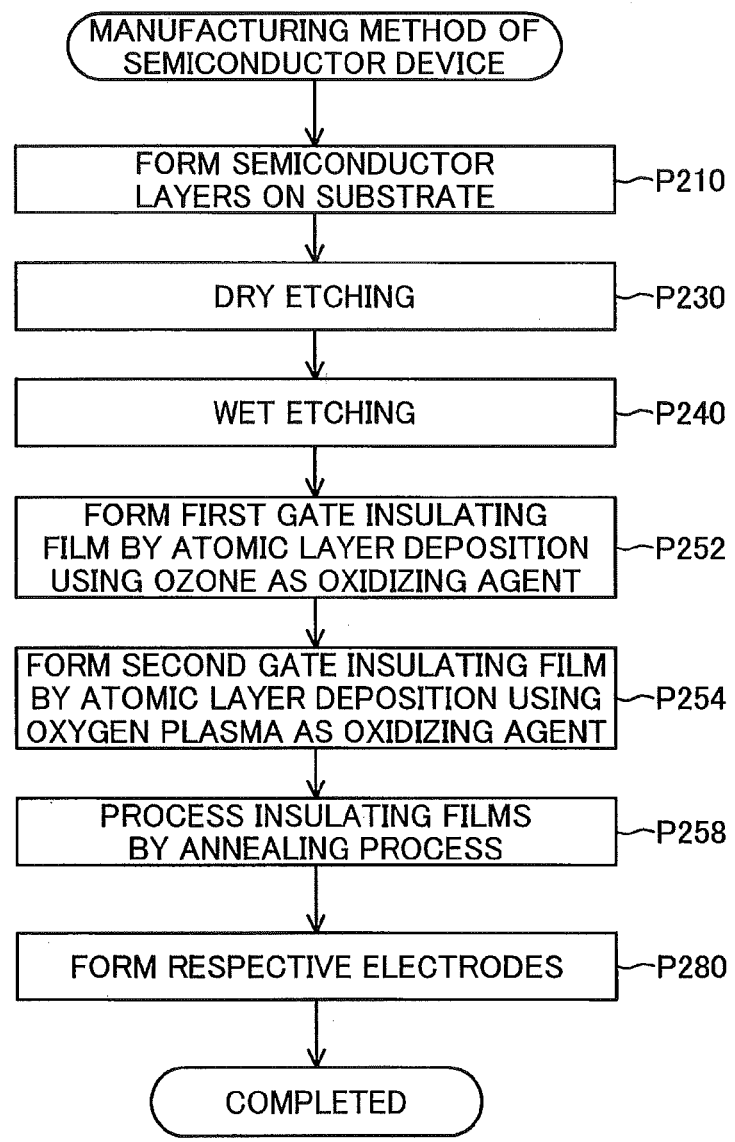
FIG. 4 is a process chart showing a manufacturing method of the semiconductor device according to the second embodiment.

FIG. 4 is a process chart showing a manufacturing method of the semiconductor device 200 according to the second embodiment. The manufacturer sequentially forms the semiconductor layers 212, 214 and 216 on the substrate 210 by epitaxial growth (process P210).

After forming the semiconductor layers 212, 214 and 216 on the substrate 210 (process P210), the manufacturer forms the trench 222 by dry etching (process P230). According to this embodiment, dry etching employed to form the trench 222 is inductively coupled plasma (ICP) dry etching.

After the dry etching (process P230), the manufacturer treats the surfaces of the respective semiconductor layers 212, 214 and 216 by wet etching (process P240). This removes damages of the respective semiconductor layers formed by dry etching (process P230). According to this embodiment, the manufacturer uses tetramethylammonium hydroxide (TMAH) as an etchant. According to another embodiment, the manufacture may omit the wet etching (process P240).

After the wet etching (process P240), the manufacturer forms the first gate insulating film 231 on the respective semiconductor layers 212, 214 and 216 by atomic layer deposition (ALD) using ozone (O3) as the oxidizing agent (process P252), in the same manner as formation of the first gate insulating film 131 (process P152) of the first embodiment.

After forming the first gate insulating film 231 (process P252), the manufacturer forms the second gate insulating film 232 on the first gate insulating film 231 by atomic layer deposition (ALD) using oxygen plasma as the oxidizing agent (process P254), in the same manner as formation of the second ate insulating film 132 (process P154) of the first embodiment.

After forming the second gate insulating film 232 (process P254), the manufacturer processes the first gate insulating film 231 and the second gate insulating film 232 by annealing process (heat treatment) (process P258), in the same manner as the annealing process (process P158) of the first embodiment.

After the annealing process (process P258), the manufacturer forms the source electrodes 241, the gate electrode 242, the drain electrode 243 and the body electrodes 244 (process P280). According to this embodiment, the manufacturer forms the source electrodes 241 in the respective contact holes 221, forms the body electrodes 244 in the respective recesses 224 and subsequently forms the gate electrode 242 on the second gate insulating film 232. The manufacturer then forms the drain electrode 243 on the substrate 210 and processes the respective electrodes by annealing process (heat treatment). The semiconductor device 200 is completed through this series of processes.

Like the first embodiment, in the second embodiment described above, the first gate insulating film 231 suppresses a decrease in channel mobility due to formation of the second gate insulating film 232, and the second gate insulating film 232 reduces the gate leakage current. Accordingly, this improves the carrier mobility, while reducing the gate leakage current. Additionally, the first gate insulating film 231 and the second gate insulating film 232 formed in the trench 222 suppress a decrease in channel mobile, while reducing the gate leakage current.

C. First Evaluation Test

Figure 5:
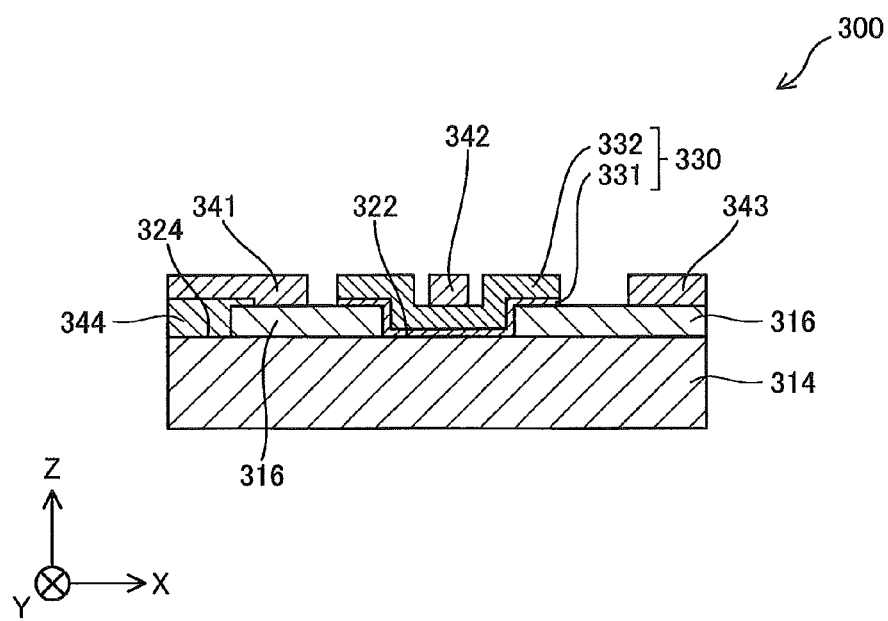
FIG. 5 is a sectional view schematically illustrating the structure of a semiconductor device used for a first evaluation test.

FIG. 5 is a sectional view schematically illustrating the structure of a semiconductor device 300 used for a first evaluation test. The semiconductor device 300 is a GaN-based semiconductor device formed by using gallium nitride (GaN) and is manufactured by a manufacturing method conforming to that of the second embodiment. Like FIG. 1, XYZ axes are illustrated in FIG. 5.

The semiconductor device 300 includes a semiconductor layer 314 and a semiconductor layer 316. The semiconductor device 300 has a trench 322 and a recess 324 as features formed in these semiconductor layers 314 and 316. Additionally, the semiconductor device 300 includes a gate insulating film 330, a source electrode 341, a gate electrode 342, a drain electrode 343 and a body electrode 344.

The semiconductor layer 314 of the semiconductor device 300 is a p-type semiconductor layer mainly made of gallium nitride (GaN). The semiconductor layer 314 is a layer extended along the X axis and the Y axis. The semiconductor layer 314 contains magnesium (Mg) as acceptor.

The semiconductor layer 316 of the semiconductor device 300 is an n-type semiconductor layer mainly made of gallium nitride (GaN). The semiconductor layer 316 is a layer that is located on the +Z-axis direction side of the semiconductor layer 314 and is extended along the X axis and the Y axis. The semiconductor layer 316 is a layer formed on the semiconductor layer 314 by epitaxial growth. The semiconductor layer 316 contains silicon (Si) as donor.

The trench 322 of the semiconductor device 200 is a groove that is formed in the semiconductor layers 314 and 316 and is recessed in a thickness direction (−Z-axis direction) of the semiconductor layers 314 and 316. The trench 322 is formed from the +Z-axis direction side of the semiconductor layer 316 to reach the semiconductor layer 314. The trench 322 is a feature formed in the semiconductor layers 314 and 316 by etching.

The gate insulating film 330 of the semiconductor device 300 is a layer having electrical insulating properties. The gate insulating film 330 is formed from outside of the trench 322 over to inside of the trench 322. The gate insulating film 330 is arranged to cover interfaces of the respective semiconductor layers 314 and 316 defining the trench 322 and part of a +Z-axis direction side interface of the semiconductor layer 316. The gate insulating film 330 includes a first gate insulating film 331 and a second gate insulating film 332.

The first gate insulating film 331 is similar to the first gate insulating film 131 of the first embodiment, except that the first gate insulating film 331 is formed on the semiconductor layers 314 and 316. The first gate insulating film 331 is a film formed by atomic layer deposition (ALD) using ozone as the oxidizing agent.

The second gate insulating film 332 is similar to the second gate insulating film 132 of the first embodiment, except that the second gate insulating film 332 is formed on the first gate insulating film 331. The second gate insulating film 332 is a film formed by atomic layer deposition (ALD) using oxygen plasma as the oxidizing agent.

The recess 324 of the semiconductor device 300 is a concave that is formed in the semiconductor layers 314 and 316 and is recessed in a thickness direction (−Z-axis direction) of the semiconductor layers 314 and 316. The recess 324 is a feature formed in the semiconductor layers 314 and 316 by etching.

The source electrode 341 of the semiconductor device 300 is an electrode that is located on the −X-axis direction side of the trench 322 and is formed on the semiconductor layer 316 and the body electrode 344. The source electrode 341 is in ohmic contact with the semiconductor layer 316. The source electrode 341 is an electrode formed by stacking a layer made of aluminum (Al) on a layer made of titanium (Ti) and subsequently alloying the stacked layers by annealing process (heat treatment).

The gate electrode 342 of the semiconductor device 300 is an electrode formed in the trench 322 via the gate insulating film 330. The gate electrode 342 is mainly made of aluminum (Al). When a voltage is applied to the gate electrode 342, an inversion layer is formed in the semiconductor layer 314. This inversion layer serves as a channel, so as to form a conductive path between the source electrode 341 and the drain electrode 343.

The drain electrode 343 of the semiconductor device 300 is an electrode that is located on the +X-axis direction side of the trench 322 and is formed on the semiconductor layer 316. The drain electrode 343 is in ohmic contact with the semiconductor layer 316. The drain electrode 343 is an electrode formed by stacking a layer made of aluminum (Al) on a layer made of titanium (Ti) and subsequently alloying the stacked layers by annealing process (heat treatment).

The body electrode 344 of the semiconductor device 300 is an electrode formed in the recess 324. The body electrode 344 is in ohmic contact with the semiconductor layer 314. The body electrode 344 is an electrode formed by stacking a layer made of gold (Au) on a layer made of palladium (Pd) and subsequently alloying the stacked layers by annealing process (heat treatment).

Figure 6:
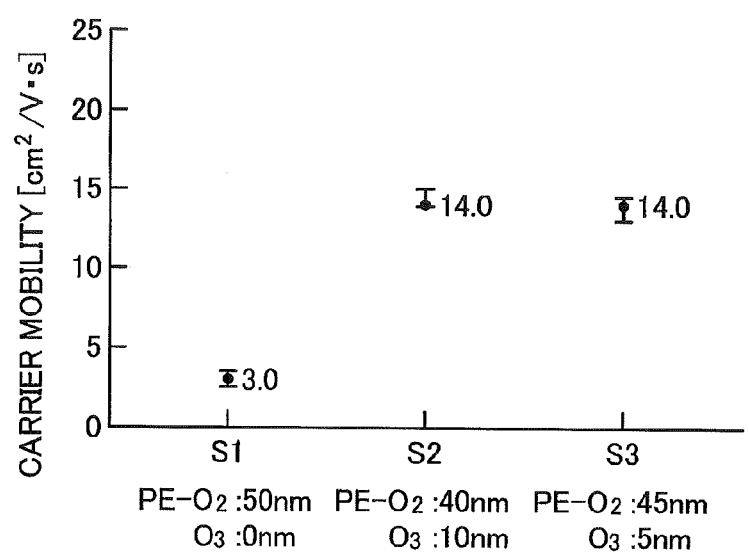
FIG. 6 is a graph showing results of evaluation with regard to carrier mobility in the first evaluation test.
Figure 7:
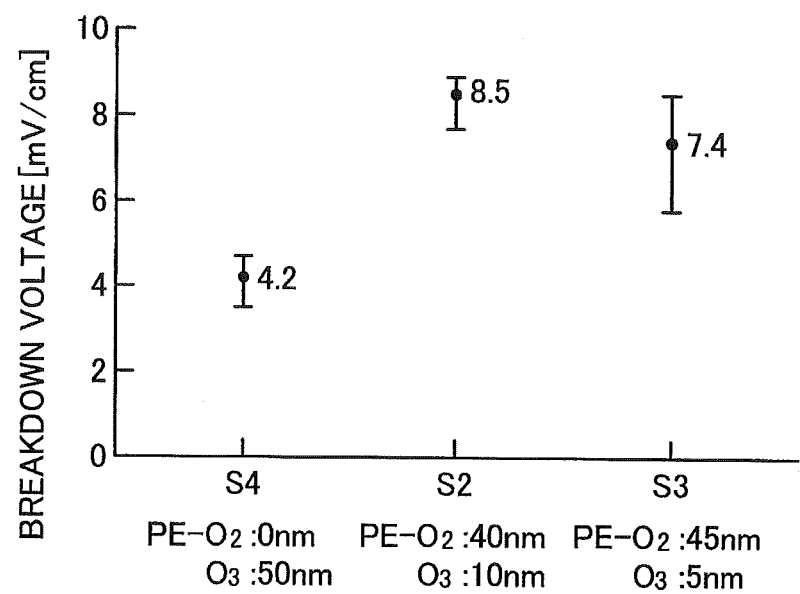
FIG. 7 is a graph showing results of evaluation with regard to gate leakage current in the first evaluation test.

FIG. 6 is a graph showing results of evaluation with regard to the carrier mobility in the first evaluation test. FIG. 7 is a graph showing results of evaluation with regard to the gate leakage current in the first evaluation test. In the first evaluation test, the tester provided ten pieces each of four different samples S1, S2, S3 and S4 having different film thicknesses of the first gate insulating film 331 and the second gate insulating film 332. The following shows the film thicknesses of the respective samples.
<Sample S1>
  second gate insulating film 332: 50 nm; and
  first gate insulating film 331: 0 nm
<Sample S2>
  second gate insulating film 332: 40 nm; and
  first gate insulating film 331: 10 nm
<Sample S3>
  second gate insulating film 332: 45 nm; and
  first gate insulating film 331: 5 nm
<Sample S4>
  second gate insulating film 332: 0 nm; and
  first gate insulating film 331: 50 nm The tester measured the carrier mobility with respect to each of the samples S1, S2 and S3 and obtained the evaluation results shown in FIG. 6. FIG. 6 shows a maximum value, a minimum value and an average value of the carrier mobility with respect to each of the samples. The evaluation results of FIG. 6 show that the first gate insulating film 331 improves the carrier mobility and that the first gate insulating film 331 having the film thickness of not less than 5 nm ensures the carrier mobility of higher than 10 cm$^2$/V·s.

The tester measured the breakdown voltage at the gate leakage current of higher than $10^{-6}$ A/cm$^2$ with respect to each of the samples S2, S3 and S4 and obtained the evaluation results shown in FIG. 7. FIG. 7 shows a maximum value, a minimum value and an average value of the breakdown voltage with respect to each of the samples. The greater breakdown voltage indicates the smaller gate leakage current. The evaluation results of FIG. 7 show that the second gate insulating film 332 improves the breakdown voltage. In other words, the second gate insulating film 332 formed on the first gate insulating film 331 reduces the gate leakage current. The second gate insulating film 332 having the film thickness of not less than 5 nm ensures the breakdown voltage of higher than 6 mV/cm.

D. Second Evaluation Test

Figure 8:
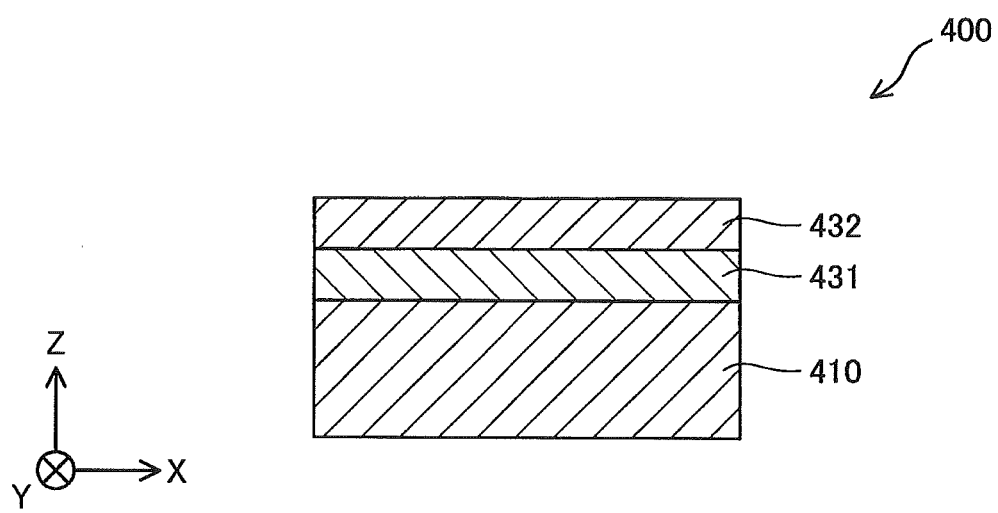
FIG. 8 is a sectional view schematically illustrating the structure of a sample used for a second evaluation test.

FIG. 8 is a sectional view schematically illustrating the structure of a sample 400 used for a second evaluation test. Like FIG. 1, XYZ axes are illustrated in FIG. 8. The sample 400 includes a substrate 410, a first insulating film 431 and a second insulating film 432.

The substrate 410 of the sample 400 is formed in a plate-like shape extended along both the X axis and the Y axis. The substrate 410 is mainly made of silicon (Si). The thickness (length in the Z-axis direction) of the substrate 410 is about 280 μm.

The first insulating film 431 of the sample 400 is a film formed on the substrate 410 by atomic layer deposition (ALD) using ozone as the oxidizing agent. The first insulating film 431 is mainly made of silicon dioxide (SiO$_2$). The thickness (length in the Z-axis direction) of the first insulating film 431 is 100 nm.

The second insulating film 432 of the sample 400 is a film formed on the first insulating film 431 by atomic layer deposition (ALD) using oxygen plasma as the oxidizing agent. The second insulating film 432 is mainly made of silicon dioxide (SiO$_2$). The thickness (length in the Z-axis direction) of the second insulating film 432 is 100 nm.

Figure 9:
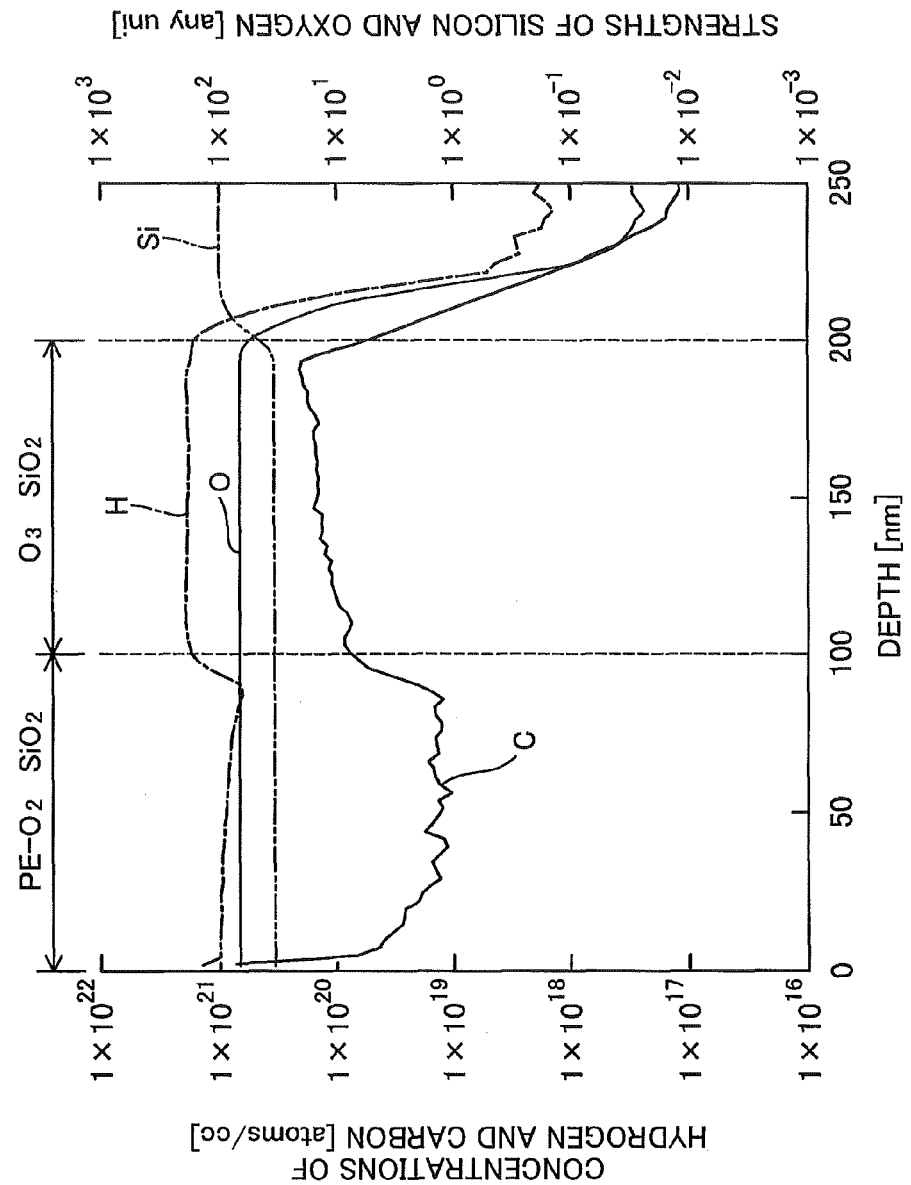
FIG. 9 is a graph showing the results of elemental analysis prior to annealing process in the second evaluation test.
Figure 10:
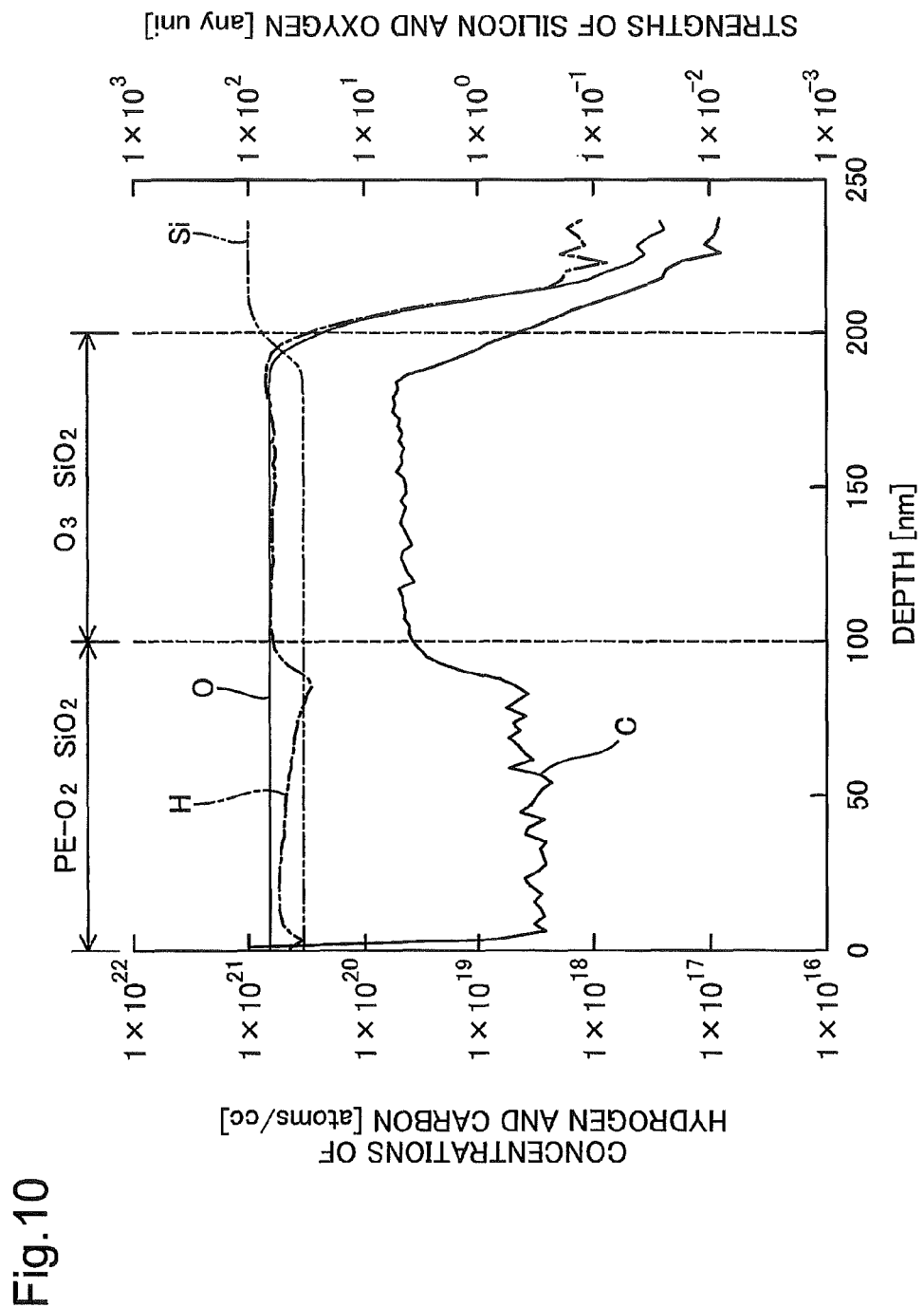
FIG. 10 is a graph showing the results of elemental analysis after the annealing process in the second evaluation test.

FIG. 9 is a graph showing the results of elemental analysis prior to annealing process in the second evaluation test. FIG. 10 is a graph showing the results of elemental analysis after the annealing process in the second evaluation test. The tester analyzed the first insulating film 431 and the second insulating film 432 of the sample 400 prior to annealing process by secondary ion mass spectrometry (SIMS) and obtained the results of elemental analysis of FIG. 9. The tester subsequently analyzed the first insulating film 431 and the second insulating film 432 of the sample 400 after the annealing process by SIMS and obtained the results of elemental analysis of FIG. 10. In the second evaluation test, the annealing temperature was 700° C., and the time of the annealing process was 30 minutes.

The carbon concentration of the first insulating film 431 was about $1\times10^{20}$ atoms/cm$^3$ before the annealing process and was decreased to about $4\times10^{19}$ atoms/cm$^3$ after the annealing process. The hydrogen concentration of the first insulating film 431 was about $2\times10^{21}$ atoms/cm$^3$ before the annealing process and was decreased to about $7\times10^{20}$ atoms/cm$^3$ after the annealing process.

The carbon concentration of the second insulating film 432 was about $1\times10^{19}$ atoms/cm$^3$ before the annealing process and was decreased to about $3\times10^{18}$ atoms/cm$^3$ after the annealing process. The hydrogen concentration of the second insulating film 432 was about $1\times10^{21}$ atoms/cm$^3$ before the annealing process and was decreased to about $5\times10^{20}$ atoms/cm$^3$ after the annealing process.

According to the results of the second evaluation test, the second insulating film 432 has the lower carbon concentration and the lower hydrogen concentration before and after the annealing process than the first insulating film 431. The annealing process decreases both the carbon concentration and the hydrogen concentration of the first insulating film 431 and the second insulating film 432. More specifically, the annealing process decreases the carbon concentration of the first insulating film 431 to the 19-th power, while decreasing the carbon concentration of the second insulating film 432 to the 18-th power. The carbon concentration of the second insulating film 432 is lower than the carbon concentration of the first insulating film 431, so that the second insulating film 432 is expected to more effectively reduce the gate leakage current than the first insulating film 431.

The carbon concentration of the second insulating film 432 formed by using oxygen plasma was the 19-th power prior to the annealing process and was decreased to the 18-th power after the annealing process. This lead to reduction of the gate leakage current. The carbon concentration of the first insulating film 431 formed by using ozone was, on the other hand, still the 19-th power even after the annealing process and was not decreased to the 18-th power by the annealing process. Based on these results, the gate leakage current is reducible by stacking the second insulating film 432 (insulating film formed by using oxygen plasma) that decreases the carbon concentration to be less than the 19-th power on the first insulating film 431 (insulating film formed by using ozone).

E. Other Embodiments

The invention is not limited to any of the embodiments, the examples and the modifications described above but may be implemented by a diversity of other configurations without departing from the scope of the invention. For example, the technical features of any of the embodiments, examples and modifications corresponding to the technical features of the respective aspects described in Summary may be replaced or combined appropriately, in order to solve part or all of the problems described above or in order to achieve part or all of the advantageous effects described above. Any of the technical features may be omitted appropriately unless the technical feature is described as essential herein.

In the embodiments described above, the material of the substrate may be any of gallium nitride (GaN), silicon (Si), sapphire (Al$_2$O$_3$) and silicon carbide (SiC).

In the embodiments described above, the donor contained in the n-type semiconductor layer is not limited to silicon (Si) but may be, for example, germanium (Ge) or oxygen (O).

In the embodiments described above, the acceptor contained in the p-type semiconductor layer is not limited to magnesium (Mg) but may be, for example, zinc (Zn) or carbon (C).

In the embodiments described above, the material of the gate insulating films is not limited to silicon dioxide (SiO$_2$) but may be another oxide such as aluminum oxide (Al$_2$O$_3$), hafnium oxide (HfO$_2$) or zirconium oxide (ZrO$_2$). In the embodiments described above, the second gate insulating film is not limited to the oxide film but may be an oxynitride film (for example, SiON, AlON or ZrON) or a nitride film (for example, SiN or AlN).

In the embodiments described above, the technique employed to form the trench and the recess is not limited to ICP dry etching but may be another dry etching technique such as electron cyclotron resonance-reactive ion etching (ECR-RIE).

In the embodiments described above, the materials of the respective electrodes are not limited to the materials described above but may be other materials.

What is claimed is:

1. A semiconductor device, comprising:
   a semiconductor layer that mainly comprises gallium nitride (GaN);
   a first gate insulating film that is formed on the semiconductor layer by atomic layer deposition using ozone as an oxidizing agent and mainly comprises an oxide;
   a second gate insulating film that is formed on the first gate insulating film by atomic layer deposition using oxygen plasma as an oxidizing agent, the second gate insulating film mainly comprising an oxide and containing carbon (C) at a lower concentration than that in the first gate insulating film; and
   a gate electrode that is formed on the second gate insulating film and the second gate insulating film substantially covers the first gate insulating film.

2. The semiconductor device according to claim 1, wherein the second gate insulating film has a carbon concentration of lower than $1\times10^{19}$ atoms/cm$^3$.

3. The semiconductor device according to claim 1, wherein the first gate insulating film has a thickness of not less than 2 nm and not greater than 20 nm.

4. The semiconductor device according to claim 1, wherein the second gate insulating film is thicker than the first gate insulating film.

5. The semiconductor device according to claim 1, wherein the semiconductor layer includes a groove that is recessed in a thickness direction of the semiconductor layer, and
   wherein the first gate insulating film and the second gate insulating film are formed from outside of the groove over to inside of the groove.

6. The semiconductor device according to claim 1, wherein the first gate insulating film mainly comprises one selected from the group
   consisting of silicon dioxide (SiO$_2$), aluminum oxide (Al$_2$O$_3$), hafnium oxide (HfO$_2$) and zirconium oxide (ZrO) as a main component, and
   the second gate insulating film mainly comprises one selected from the group consisting of silicon dioxide (SiO$_2$), aluminum oxide (Al$_2$O$_3$), hafnium oxide (HfO$_2$) and zirconium oxide (ZrO$_2$) as a main component.

7. The semiconductor device according to claim 1, further comprising a first epitaxially grown layer disposed on a surface of the semiconductor layer; and
   a second epitaxially grown layer disposed on a surface of the first epitaxially grown layer,
   wherein the first gate insulating film penetrates inside the semiconductor layer, and
   wherein the second gate insulating film penetrates inside the semiconductor layer.

8. The semiconductor device according to claim 1, wherein the oxide of the second gate insulating film comprises silicon dioxide (SiO$_2$).

9. A manufacturing method of a semiconductor device, the manufacturing method comprising:
   forming a first gate insulating film that mainly comprises an oxide on a semiconductor layer that mainly comprises gallium nitride (GaN) by atomic layer deposition using ozone as an oxidizing agent;

forming a second gate insulating film mainly comprises an oxide on the first gate insulating film by atomic layer deposition using oxygen plasma as an oxidizing agent; and forming a gate electrode on the second gate insulating film.

10. The manufacturing method of a semiconductor device according to claim 9, wherein the forming the first gate insulating film forms the first gate insulating film to have a film thickness of not less than 2 nm and not greater than 20 nm.

11. The manufacturing method of a semiconductor device according to claim 9, wherein the forming the second gate insulating film forms the second gate insulating film to be thicker than the first gate insulating film.

12. The manufacturing method of a semiconductor device according to claim 9, further comprising forming in the semiconductor layer a groove that is recessed in a thickness direction of the semiconductor layer, before forming the first gate insulating film, wherein the first gate insulating film and the second gate insulating film are formed from outside of the groove over to inside of the groove.

13. The manufacturing method of a semiconductor device according to claim 9, further comprising treating surface of the semiconductor layer by wet etching, before forming the first gate insulating film.

14. The manufacturing method of a semiconductor device according to claim 9, further comprising maintaining temperature of the semiconductor layer to be not lower than 200° C. and not higher than 600° C. during formation of the first gate insulating film and the second gate insulating film.

15. The manufacturing method of a semiconductor device according to claim 9, wherein the forming the first gate insulating film forms the first gate insulating film by atomic layer deposition using an oxidizing agent containing ozone of not lower than 2 atomic percent and not higher than 30 atomic percent.

16. The manufacturing method of a semiconductor device according to claim 9, wherein the forming the second gate insulating film forms the second gate insulating film by atomic layer deposition using as the oxidizing agent oxygen plasma generated by a high frequency power source of not less than 200 W and not greater than 2000 W.

17. The manufacturing method of a semiconductor device according to claim 9, further comprising processing the first gate insulating film and the second gate insulating film by an annealing process at a temperature of not lower than 300° C. and not higher than 900° C.

18. The manufacturing method of a semiconductor device according to claim 9, wherein a concentration of carbon in the second gate insulating film is less than a concentration of carbon in the first gate insulating film.

19. A semiconductor device, comprising:

a semiconductor layer that mainly comprises gallium nitride (GaN); a first gate insulating film that is formed on the semiconductor layer; a second gate insulating film mainly comprising silicon dioxide ($SiO_2$) formed on the first gate insulating film; and a gate electrode that is formed on the second gate insulating film, wherein a concentration of carbon in the second gate insulating film is less than a concentration of carbon in the first gate insulating film; and wherein the second gate insulating film substantially covers the first gate insulating film.

20. The semiconductor device according to claim 19, wherein the first gate insulating film is formed on the semiconductor layer by atomic layer deposition using ozone as an oxidizing agent, and wherein the second gate insulating film that is formed on the first gate insulating film by atomic layer deposition using oxygen plasma as an oxidizing agent.

* * * * *